United States Patent
Bertin et al.

(10) Patent No.: US 6,177,818 B1
(45) Date of Patent: Jan. 23, 2001

(54) COMPLEMENTARY DEPLETION SWITCH BODY STACK OFF-CHIP DRIVER

(75) Inventors: Claude L. Bertin, Burlington; Anthony R. Bonaccio, Shelburne; Howard L. Kalter, Colchester; Thomas M. Maffitt, Burlington, all of VT (US); Jack A. Mandelman, Stormville, NY (US); William R. Tonti, Essex Junction, VT (US)

(73) Assignee: International Business Machines Corporation, Amonk, NY (US)

( * ) Notice: Under 35 U.S.C. 154(b), the term of this patent shall be extended for 0 days.

(21) Appl. No.: 09/303,508

(22) Filed: Apr. 30, 1999

(51) Int. Cl.[7] .............................. H03B 21/00; H03B 1/00
(52) U.S. Cl. ....................... 327/108; 327/109; 327/111; 327/112; 327/434; 327/437; 326/25; 326/82; 326/83
(58) Field of Search ................ 327/108–112, 170, 327/434, 437; 326/82, 83, 87, 23–25

(56) References Cited

U.S. PATENT DOCUMENTS

| | | | |
|---|---|---|---|
| 3,988,616 | 10/1976 | Shimada | 326/87 |
| 4,286,174 | 8/1981 | Dingwall | 327/437 |
| 4,634,893 | 1/1987 | Craycraft et al. | 326/83 |
| 4,791,326 | 12/1988 | Vajdic et al. | 327/437 |
| 5,128,567 | 7/1992 | Tanaka et al. | 327/437 |
| 5,198,699 | 3/1993 | Hashimoto et al. | 327/108 |
| 5,461,330 | * 10/1995 | Gist et al. | 326/17 |
| 5,568,082 | * 10/1996 | Hedberg | 327/437 |
| 5,625,648 | * 4/1997 | Hedberg | 327/437 |
| 5,659,261 | 8/1997 | Bacrania et al. | 327/112 |
| 5,736,888 | * 4/1998 | Sharpe-Geisler | 327/382 |
| 5,999,034 | * 12/1999 | Singh et al. | 327/437 |

* cited by examiner

Primary Examiner—Kenneth B. Wells
Assistant Examiner—Long Nguyen
(74) Attorney, Agent, or Firm—John J. Goodwin

(57) ABSTRACT

An off-chip driver circuit including an enhancement PFET, a depletion PFET, a depletion NFET and an enhancement NFET connected in series. The large enhancement PFET and large enhancement NFET turn off the OCD in tri-state and to turn off the unused half of the OCD to prevent overlap current when driving a '0' or a '1'. A first gate signal is applied to the gate of the enhancement PFET and a second gate signal is applied to the enhancement NFET. A fixed voltage is connected to the gate of the depletion NFET and ground to gate of the depletion PFET. An output signal is obtained from a node between the depletion PFET and depletion NFET devices. In another embodiment, a reflection/overshoot sensor 60 is added. The output of sensor is connected to the body of a depletion PFET and an NFET. The feedback from sensor is such that the threshold voltage of the depletion devices are made more positive if the sensor detects that the output is being over-driven. A more positive threshold voltage will reduce the driver's IDS, but leaves the device in the linear mode.

5 Claims, 1 Drawing Sheet

COMPLEMENTARY DEPLETION SWITCH BODY STACK OFF-CHIP DRIVER

BACKGROUND OF THE INVENTION

1. Field of the Invention

The present invention relates to semiconductor integrated circuits, and more particularly to output driver circuits (OCD) for integrated circuits.

2. Background Art

U.S. Pat. No. 5,659,261 issued Aug. 19, 1997 to Bacrania et al. entitled ANALOG-TO-DIGITAL CONVERTER AND OUTPUT DRIVER discloses an A-to-D converter including an output buffer with drivers that have pullup and pulldown transistors both coupled to an output. One of the transistors is connected to a first potential and the second transistor is connected to a second potential. A base drive circuit provides added current to saturate the pulldown transistor and thereby lower the collector-to-emitter voltage drop when the pulldown transistor is turned on.

U.S. Pat. No. 5,198,699 issued Mar. 30, 1993 to Hashimoto et al. entitled CAPACITOR-DRIVEN SIGNAL TRANSMISSION CIRCUIT discloses a switching circuit having its output connected to a transmission line. The switching circuit operates to couple a first capacitor to the switching circuit output in response to receiving an input signal of a first bit value. The switching circuit further operates to couple a second capacitor to the output in response to receiving an input signal of a second bit value. The bit value is thereby propagated into the transmission line.

U.S. Pat. No. 5,128,567 issued Jul. 7, 1992 to Tanaka et al. entitled OUTPUT CIRCUIT OF SEMICONDUCTOR INTEGRATED CIRCUIT WITH REDUCED POWER SOURCE LINE NOISE discloses an output circuit of an semiconductor integrated circuit having a plurality of output transistors with different current driving abilities and a plurality of delay means for driving the output transistors at different delay times.

U.S. Pat. No. 4,791,326 issued Dec. 13, 1988 to Vajdic et al. entitled CURRENT CONTROLLED SOLID STATE SWITCH discloses a current controlled switch that compensates for switching time variation. A compensated current source operates with a current mirror to set the switching current and control the peak switching current in the switch, thereby controlling the switching transition time.

U.S. Pat. No. 4,634,893 issued Jan. 6, 1987 to Craycraft et al. entitled FET DRIVER CIRCUIT WITH MASK PROGRAMMABLE TRANSMISSION RATES discloses a field effect transistor circuit that has different rates of change of the output signal depending on fabrication mask designation of selected transistors to be either depletion or enhancement type devices.

U.S. Pat. No. 3,988,616 issued Oct. 26, 1976 to Shimada entitled DRIVER CIRCUIT FOR LIQUID CRYSTAL DISPLAY USING INSULATED GATE FETS discloses a driver circuit that comprises an output circuit having depletion and enhancement type FETs connected in series. A control signal is supplied directly to the gate of the enhancement FET and, through an inverter, to the gate of the depletion FET to provide a push-pull driver circuit.

SUMMARY OF THE INVENTION

An object of the present invention is to provide an improved off-chip driver (OCD) circuit that achieves high performance while controlling noise generation.

Another object of the present invention is to provide an improved OCD circuit with reduced output buffer rate of change of current with time (Di/Dt).

Still another object of the present invention is to provide an improved OCD circuit with maximized slew rate, that is, the rate of change of output voltage with time Dv/Dt.

Other features, advantages and benefits of the present invention will become apparent in the following description taken in conjunction with the following drawings. It is to be understood that the foregoing general description and the following detailed description are exemplary and explanatory but are not to be restrictive of the invention.

The accompanying drawings which are incorporated in and constitute a part of this invention and, together with the description, serve to explain the principles of the invention in general terms. Like numerals refer to like parts throughout the disclosure.

DESCRIPTION OF THE INVENTION

Off-chip drivers (OCDs) are devices that are employed in integrated circuits to drive data represented by 1's and 0's onto external buses within determined performance goals, without generating significant noise. Performance is typically measured as a factor of slew rate, which is the rate of change in output voltage with time (Dv/Dt) at a certain load capacitance or output impedance. Noise is typically measured as the rate of change of output driver current with time (Di/Dt), which in turn creates changes in voltages internal to the chip and/or voltage variations such as undershoot and undershoot on the bus that the OCD is driving. Consequently, it is necessary to maximize OCD performance, (i.e. the slew rate Dv/Dt), and also minimize noise generation (i.e. Di/Dt).

Figure 1:
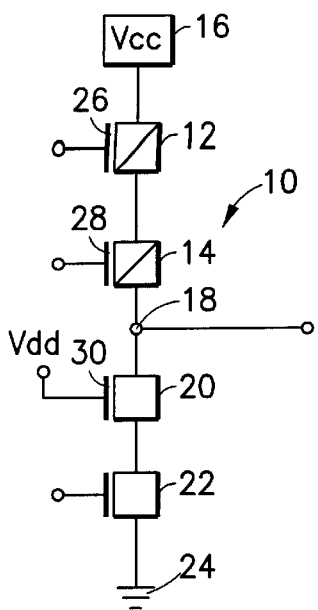
FIGS. 1 and 2 are schematic illustrations of prior art OCD circuits.

Referring to FIG. 1, an off-chip driver circuit 10 according to the prior art is shown including two stacked enhancement PFET's 12 and 14 disposed on an integrated circuit chip that are connected in series between an external power supply 16 that provides a voltage Vcc, and an output node 18. Two enhancement NFETs 20 and 22 are connected in series between the output node 18 and ground 24. The PFET devices 12 and 14 and the NFET devices 20 and 22 function in a two voltage environment, the supply voltage to the chip Vcc from power supply 16, which may for example be 5 volts, and the internal or regulated voltage Vdd, which may for example be 2.5 volts.

The gate electrode 26 of PFET 12 is at Vcc volts when the chip is in a tri-state mode, or when driving a '0', and at the threshold voltage Vt volts above ground when driving a '1'. The gate electrode 28 of PFET 14 is at Vdd volts for tri-state mode and driving a '0' and Vt volts above ground when driving a '1'. The gate electrode of NFET 22 is at 0 volts when the driver circuit is tri-stated or driving a '1' and Vdd volts when pulling the output to a '0'. The circuit of FIG. 1 and the management of gate voltages controls gate stresses that result when an OCD is required to work in a mixed voltage environment. A mixed voltage occurs when the maximum voltage that the device technology can support is less than the voltage environment in which the chip operates.

Since the pullup PFET's 12 and 14 and pulldown NFET's 20 and 22 in FIG. 1 are enhancement devices, they operate in the saturation mode a large percentage of the time required to charge or discharge the output node 18. That is, the mode wherein Vds is greater than Vgs−Vt. Consequently, the drive current is independent of Vds and is set only by the gate to source voltage Vgs. The drain to source current Ids is proportional to (Vgs−Vt) squared. As a result, in the case of the OCD driving a '0', the current capacity to discharge the load is constant until Vds=Vgs−Vt or less than 2 volts where Vgs=2.5 volts and Vt is approximately 0.6 volts. If Vds starts at 5 volts, then the load capacitance discharges more than 60 percent without any change in the driver current sinking capacity or impedance. As a result, the rate of change of voltage Dv/Dt, or slew rate, accelerates as the capacitance discharges and the output approaches its final downlevel.

In terms of current, the discharging capacitor sees an accelerating change in driver current (Di/Dt) since the load capacitance is discharging but the driver current sink capacity (and impedances) is constant. In the capacitive and inductive parasitic environment in which the OCD driver operates, the Dv/Dt and Di/Dt generated by the driver causes voltage undershoots and overshoots, slope reversals, and reflections on the driver bus in addition to on chip ground and supply rail noises.

In the existing prior art, the inherent noise generating situation of the NFET operating in the saturation mode is addressed by careful control of the gate to source voltage (i.e. Vgs of device 22). The Vgs voltage of NFET 22 is carefully decreased in order to control the Di/Dt of the OCD as it discharges the load capacitance. The circuit of FIG. 1 therefore relies on the successful control of the Vgs voltage based on the devices Vds, a difficult feedback problem to control.

The same conditions exist in the pullup devices, i.e. the PFET 14 is operated in saturation mode through the majority of the time the output transitions from 0 volts to Vcc (5 volts in the circuit of FIG. 1). Consequently, the same noise generation issues exist, as does the managing of the Vgs of PFET 14.

Figure 2:
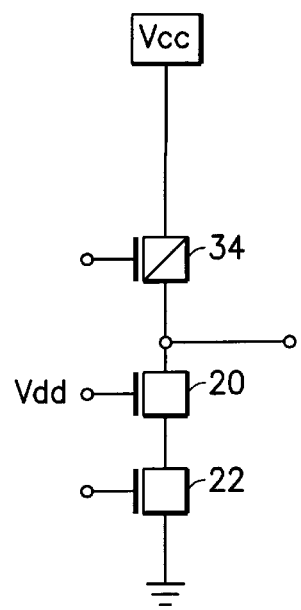

FIG. 2 illustrates another example of a prior art OCD circuit. In the circuit of FIG. 2, the NFETs 20 and 22 are the same as in FIG. 1, but the pullup function is carried out by a single PFET 34. The use of a single PFET 34 is possible only in the specific case when the technology in which FIG. 1 is implemented allows a voltage of 0 volts to Vcc across PFET 34 in the case where the output is driving to 0 volts or pulled to 0 volts in a write cycle. Otherwise the noise issues resulting from operating the single PFET 34 in saturation are the same as in FIG. 1, as is the prior art solution to control the Vgs.

Figure 3:
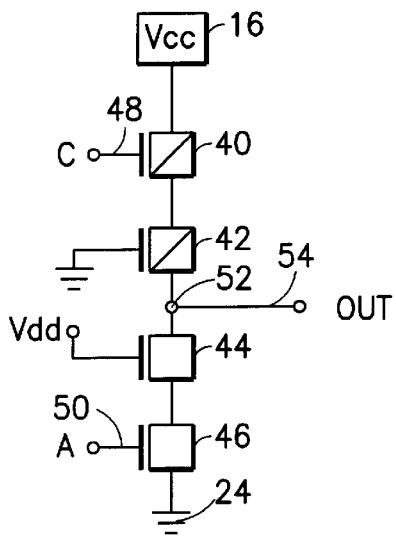
FIGS. 3 and 4 are schematic illustrations showing first and second embodiments of OCD circuits according to the principles of the present invention.

Referring to FIG. 3, a first embodiment of an OCD circuit of the present invention is illustrated. An enhancement PFET 40, a depletion PFET 42, a depletion NFET 44 and an enhancement NFET 46 are connected in series between voltage source Vcc and ground. Devices 40, 42, 44 and 46 may be fabricated on bulk silicon or on SOI. Enhancement PFET 40 and a large enhancement NFET 46 are required to turn off the OCD in tri-state and to turn off the unused half of the OCD to prevent overlap current when driving a '0' or a '1'. A gate signal C is applied to the gate of enhancement PFET 40 on lead 48, and a gate signal A is applied to NFET 46 on lead 50. A gate voltage VDD having a value, for example of 2.5 volts, is connected to the gate of the depletion NFET 44. The gate of the depletion PFET 42 is grounded. The output signal is obtained on the output lead 54 connected to node 52 between devices 42 and 44.

Figure 5:
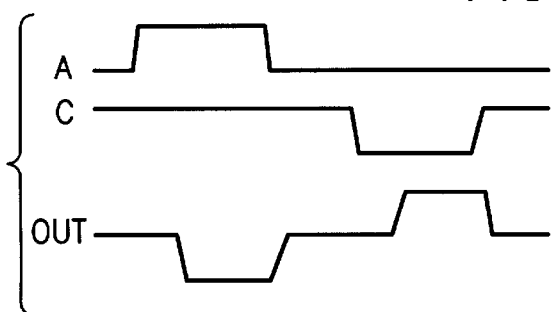
FIG. 5 is an illustration of the timing relationship of the circuits of the present invention.

The timing of the gate voltages of the gate voltages A and C and the output voltage on lead 54 are shown in FIG. 5.

The depletion devices 42 and 44 in the embodiment of FIG. 3 are the significant elements of the present invention. PFET 42 and NFET 44 can be considered as having a negative threshold voltage Vt, that is, the devices 42 and 44 are off when their gate to source voltages Vgs are less than 0 minus Vt. This Vt may be several volts negative (−2.5 volts in this example). As a result, PFET 42 and NFET 44 operate in the linear region for the full range of their drain to source voltages Vds. The linear mode occurs when Vds is less than Vgs minus Vt or Vds is less than 2.5 minus −2.5=5.0.

Consequently, in the pulldown case, the output transitions from 5.0 volts to 0 volts in the linear mode. Since the drain to source current Ids is proportional to (Vgs−VT)Vds−(Vds squared), the Ids current is controlled by both Vgs and Vds.

For a fixed Vgs, during pulldown Ids decreases as the output (Vds) decreases. In this way, the discharging capacitive load sees a decreased current sink, which is a higher impedance, as the output approaches the final level. As a result, both the output node voltage change Dv/Dt and the output sink current change Di/Dt change less as the load is discharged then if the devices operated in saturation.

The same occurrences are applicable for the pullup case. This self-regulating discharge as a function of Vds reduces chip and output buss noise that results from capacitive and inductive interactions with rapidly changing voltages and currents. In this way, the use according to the present invention, of the depletion devices in the output drive circuit reduce the noise generated during output transitions.

Figure 4:
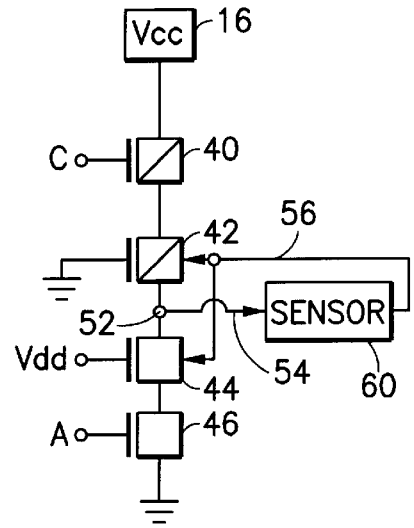

Referring to FIG. 4, another embodiment of the present invention is shown. In FIG. 4, device 40 is an enhancement PFET and device 42 is a depletion PFET as in FIG. 3. Device 44 is a depletion NFET and device 46 is an enhancement NFET as in FIG. 3. In the embodiment of FIG. 4 a reflection/overshoot sensor 60 is added to the circuit and connected to node 52 between PFET device 42 and NFET device 44. The output of sensor 60 is connected back to the bodies of the depletion PFET 42 and depletion NFET 44 as a feedback signal on lead 56. The feedback signal from sensor 60 is such that the threshold voltages Vt of the depletion devices 42 and 44 are made more positive when the sensor detects that the output is being over-driven. A more positive Vt will reduce Ids while leaving the devices in the linear mode since overshoot/undershoot happens when Vds is approaching zero.

What has been described is an improved OCD circuit using depletion devices in a complementary circuit that can be employed to reduce buss and on chip noise that are inherent when a large load must be driven at high performance. This is possible because the depletion devices operate in the linear mode for the entire output transition, thus providing a self-regulating negative feedback to the drivers current drive capability, and hence reduced noise.

While the invention has been described in connection with a preferred embodiment, it is not intended to limit the scope of the invention to the particular form set forth, but on the contrary, it is intended to cover such alternatives, modifications and equivalence as may be included within the spirit and scope of the invention as defined in the appended claims.

What is claimed is:

1. A semiconductor off-chip driver circuit comprising:

an enhancement PFET device connected in series to a depletion PFET device which is connected to an output terminal and to a depletion NFET device, the depletion NFET device being connected in series to an enhancement NFET device, and wherein the depletion PFET device and the depletion NFET device operate in a linear mode to provide a self-regulating negative feedback.

2. The semiconductor off-chip driver circuit of claim 1 wherein the depletion PFET device and the depletion NFET device have a negative threshold voltage Vt wherein the depletion PFET device and depletion NFET device operate in the linear mode when the drain to source voltage of the PFET depletion device and the NFET depletion device have a value less than gate to source minus Vt.

3. The semiconductor off-chip driver circuit of claim 2 wherein the gate electrode of the enhancement PFET device is connected to a gate signal C, and the gate electrode of the enhancement NFET is connected to a gate signal A wherein the gate signal C comprises a sequence of negative pulses, the gate signal A comprises a sequence of positive pulses, and wherein the off-chip driver circuit provides an output signal on the output terminal comprising a sequence of alternate positive and negative pulses.

4. The semiconductor off-chip driver circuit of claim 2 further including a reflective/overshoot sensor circuit connected to the output terminal, the sensor circuit having a feedback lead connected to the bodies of the depletion PFET and the depletion NFET.

5. The semiconductor off-chip driver circuit of claim 2 wherein the off-chip driver circuit includes a connection to the semiconductor chip, wherein the semiconductor chip includes circuits that operate in a tri-state mode, and wherein the enhancement PFET and the enhancement NFET turn off the off-chip driver circuit when the semiconductor chip circuits operate in the tri-state mode.

* * * * *